United States Patent [19]

Gupta

[11] Patent Number: 5,328,555
[45] Date of Patent: Jul. 12, 1994

[54] REDUCING PARTICULATE CONTAMINATION DURING SEMICONDUCTOR DEVICE PROCESSING

[75] Inventor: Anand Gupta, San Jose, Calif.

[73] Assignee: Applied Materials, Inc., Santa Clara, Calif.

[21] Appl. No.: 980,828

[22] Filed: Nov. 24, 1992

[51] Int. Cl.⁵ .......................................... H01L 21/00
[52] U.S. Cl. .......................... 156/643; 156/345; 204/298.3; 204/298.32; 134/1
[58] Field of Search ............ 156/643, 345, 651, 653; 118/723; 134/1; 204/192.32, 192.33, 298.31, 298.32

[56] References Cited

U.S. PATENT DOCUMENTS

| | | | |
|---|---|---|---|
| 4,340,462 | 7/1982 | Koch | 156/643 |
| 5,043,299 | 8/1991 | Chang et al. | 118/715 |
| 5,244,535 | 9/1993 | Ohtsuka et al. | 156/643 |
| 5,248,636 | 9/1993 | Davis | 156/643 |

FOREIGN PATENT DOCUMENTS

| | | |
|---|---|---|
| 58-014535 | 1/1983 | Japan . |
| 58-154229 | 9/1983 | Japan . |
| 01-146327 | 6/1989 | Japan . |
| 03-036724 | 2/1991 | Japan . |

OTHER PUBLICATIONS

Selwyn et al, "In-situ particulate contamination . . ." SPIE Conf. Proc. 1989.
Selwyn et al, "Laser diagnostic techniques . . ." J. Vac. Sci. Technol. A6(3) May/Jun. 1988.

*Primary Examiner*—Brian E. Hearn
*Assistant Examiner*—George Goudreau
*Attorney, Agent, or Firm*—Birgit E. Morris

[57] ABSTRACT

A process of removing particles from the surface of a substrate to be processed in a vacuum chamber comprising forming a plasma from an inert plasma precursor gas in said chamber, thereby lifting loosely adhered particles from the surface of the substrate, and increasing the flow of said inert gas without increasing the pressure in the vacuum chamber, thereby sweeping the particles beyond the surface of the substrate, where they can be removed by the vacuum chamber exhaust system. Particles having a particle size of about 0.1 micron or larger can be removed in this fashion.

7 Claims, 1 Drawing Sheet

REDUCING PARTICULATE CONTAMINATION DURING SEMICONDUCTOR DEVICE PROCESSING

This invention relates to removal of particulate contaminants during semiconductor processing. More particularly, this invention relates to a method for removing contaminant particles present in a plasma reactor.

BACKGROUND OF THE INVENTION

In the manufacture of microelectronic devices, particularly VLSI and ULSI devices, in which the overall dimensions of devices are becoming bigger and more closely packed, and the critical dimensions are becoming much smaller, particle contamination is of increasing concern. The presence of particles during deposition or etching of thin films can cause voids, dislocations or shorts which adversely affect performance and reliability of the devices.

The problem of contaminant particles was addressed initially by improving the quality of clean rooms and improving automated equipment to handle materials and semiconductor substrates, e.g., silicon wafers. Improved cleaning of wafer surfaces was also addressed. These improvements have greatly reduced the number of particles that are present or fall onto a wafer surface during the processing cycle. However, many particles are generated inside the wafer processing chambers themselves due to the materials formed or used for processing and due to mechanical manipulations, for example the rubbing movements of robotic equipment during substrate transfer operations and the like.

In particular during processing that uses a plasma, many fragments of various kinds are generated from the processing gases, including ions, electrons, uncharged particles and the like. The plasma generated fragments can combine to form generally slightly negatively charged particles, i.e., on the order of $10^4$ negative charge. In addition, the processing chamber becomes coated with various materials, such as polymers, during plasma processing of a wafer. Stress, such as stress due to thermal cycling and the like, causes these films to fracture and dislodge from the walls and surfaces on which they have deposited, also generating particles. In addition, particles are generated within the processing chambers during wafer transfer operations, pump oil backstreaming and the like.

Selwyn et al have disclosed one solution to avoiding deposition of particles onto a wafer. They redesigned the wafer support electrode to provide grooves therein which provide a disturbance around the periphery of the wafer, and beyond the wafer surface. This attracts particles to this disturbed region beyond the wafer so that the vacuum chamber exhaust system can carry particles away from the wafer and outside of the processing system. While a reduction of particles of up to 70% is said to be obtained, it does require redesign of wafer support electrodes and retrofitting of existing equipment, which is expensive.

Selwyn et al have also suggested that during plasma processing, particles form and collect at the plasma/sheath boundary. At the end of plasma processing when the RF power is shut off, these particles fall onto the wafer. They further teach that this is a major source of particulate contamination of wafer surfaces in a plasma chamber. They suggested that the number of particles be reduced by turning off the RF power slowly, so that particles are released from the sheath region more slowly, and can be evacuated by the chamber exhaust system rather than drop onto the wafer. This solution however is uncontrollable at best.

It would be highly desirable to develop a reliable, inexpensive process to remove particles from substrate surfaces and from plasma processing chambers.

SUMMARY OF THE INVENTION

Loosely adhered particles on the surface of a substrate, such as a semiconductor wafer, whether formed during plasma processing, dislodged during plasma processing or formed during a plasma pre-clean step, can be removed from the surface of a substrate to be processed by forming a non-reactive plasma, e.g., of argon; when the plasma is turned on, any loosely adhered particles are lifted above the surface of the substrate. By subsequently increasing the flow of the inert plasma precursor gas, but without changing the pressure of the vacuum chamber, the lifted particles are swept away into the vacuum chamber exhaust system. This lifting phenomenon is applicable to loosely adhered particles having a particle size of about 0.1 micron or higher.

DETAILED DESCRIPTION OF THE INVENTION

Prior to plasma etch or PECVD processing of a substrate, or subsequent to a substrate pre-clean step, in accordance with the present invention, loosely adhered particles on the surface of a substrate are lifted above the surface of the substrate by turning on a plasma formed from a stream of an inert gas such as argon. Turning on the plasma lifts the loosely adhered particles above the surface of the substrate, whereupon increasing the flow of argon or other inert gas, while maintaining the chamber pressure at about 50 millitorr (hereinafter mT) or less can sweep the particles beyond the edge of the substrate where they can be carried away by the vacuum chamber exhaust system.

Very small particles, e.g., those smaller than about 0.1 micron, adhere more strongly to the surface of substrates than do larger particles, and thus may not be lifted when the plasma is turned on. However, particles 0.1–1 micron or larger in size are more loosely adhered to the substrate surface and thus can be lifted and carried away readily in a gaseous stream.

Figure 1:
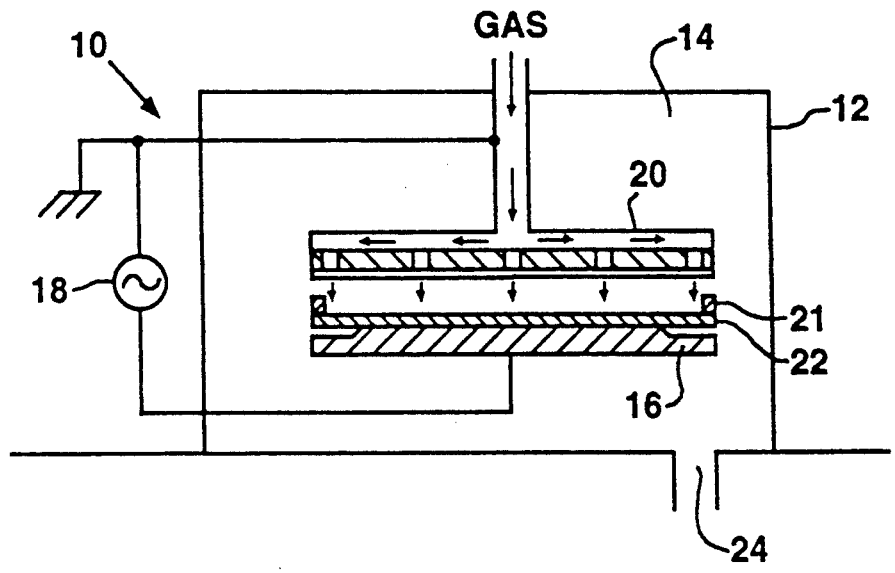
FIG. 1 is a cross sectional view of a conventional etch chamber.

A plasma can be formed in a conventional etch chamber by applying RF power of about 100–300 Watts. Referring to FIG. 1, a conventional etch reactor 10 comprises a housing 12, typically made of a non-magnetic material such as aluminum, which defines an etch chamber 14. A cathode 16 for supporting the substrate to be processed is connected to a source 18 of RF energy. Processing gases and inert gases are supplied to the chamber 14 via a gas manifold 20. The gas manifold 20 is positioned over and closely spaced to the cathode 16. A wafer 22 to be processed is positioned on the cathode support 16 and affixed to the cathode 16 by means of a clamping ring 21. An exhaust line 24, connected to a vacuum pump (not shown) continually evacuates the chamber 14. In operation, the gas supply is started and the RF power is turned on, when a plasma is formed in the space between the gas manifold 20 and the wafer 22.

An etch chamber having a wafer transfer system that reduces the generation of particles is described in U.S. Pat. No. 4,951,601. However, I have found that particles are nevertheless generated in the plasma, either through a combination of various plasma species or because of flaking of deposited material on the walls and other surfaces of the chamber.

Figure 2:
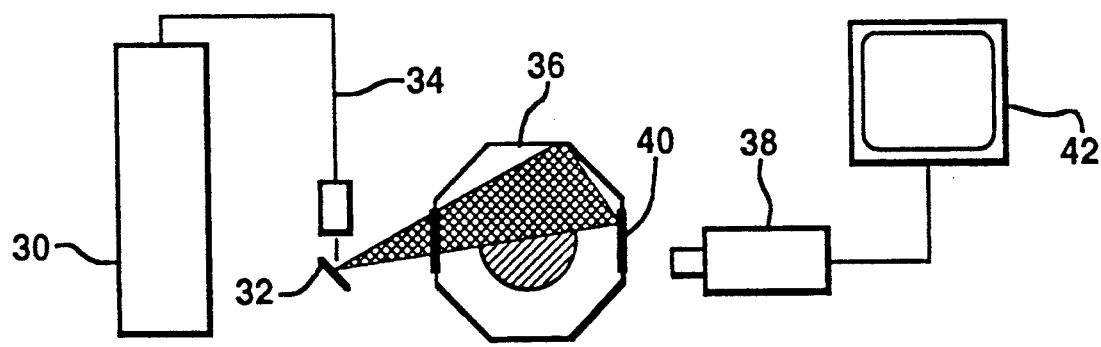
FIG. 2 is a schematic diagram of a laser light scattering system useful herein.

The particles present on the surface of a wafer in an etch chamber can be viewed by a laser light scattering system as shown in FIG. 2.

Referring to FIG. 2, an argon laser 30 is connected to a scanner 32 by means of a fiber optic cable 34. Suitably, the laser is a 5 W water cooled multiple line argon laser coupled to a fiberoptic cable. This cable can be mounted in a laser holder attached to a vertical shaft supported on a rotational base. Other lasers can also be used however, such as a 514.5 nm wavelength laser. The scanner 32, a galvanometer, is mounted on a custom holder attached to an adjustable vertical stage. The laser and the scanner slide on an optical rail situate parallel to the chamber viewport. This arrangement provides X, Y and Z motion and adjustment of the laser. The consistency of the light plane is controlled by a frequency generator input of 0.1 Hz to about 500 Hz. The amount of oscillation (the angle of rotation) can be varied by an input amplitude voltage up to one volt. A DC offset controls the starting position of the angle of rotation. The scanner 32 accesses the interior of an etch chamber 36. A three chip CCD high resolution RGB video camera 38 is mounted on an angular adjustable platform attached to a vertical shaft that slides on an optical rail. The camera has access to the interior of the etch chamber 36 by means of a window 40 in the wall of the chamber. The camera 38 is set up to provide various focal lengths by adjustment of the viewing distance from the window 40 to the camera 38. The video camera 38 is connected to a TV monitor 42 for viewing the particles inside the chamber 36.

The above system was set up so that the focus distance between the end of the fiber optic laser source and the scanner was approximately 3–4 inches on a 12.5 nm round mirror, oscillating at 300 Hz. The laser intensity was 1.75 w at a wavelength of 514.5 nm. The beam was projected through the chamber window and terminated on the interior chamber wall at 45 degrees from the point of entry. The beam had a divergence of about one inch and a length of 4–6 inches from the slit valve entry to the exit viewport. The TV camera was set so that it had a view through the exit window and was focused on the edge of the wafer nearest the slit valve. It had a slight downward angle that provided a view just inside of the wafer clamping ring. The distance from the camera to the edge of the wafer was about 12–13 inches.

As an example, a wafer was dusted with alumina particles about 1.6–3.0 microns in size and placed in an etch chamber as in FIG. 1. While maintaining the chamber pressure at 25 mT, the RF power was turned on at 200 watts while maintaining an argon gas flow of 25 sccm in the chamber. Viewing the surface of the chamber through the laser light scattering system of FIG. 2, the alumina particles can be seen to rise up above the surface of the wafer when the power is turned on.

By increasing the gas flow of argon to 50 sccm, the particles are gradually seen to lessen; by increasing the gas flow of argon to 100 sccm and 145 sccm, all of the particles are moved out of range of the camera. Thus turning on a plasma from an inert gas such as argon first lifted the particles above the surface, where they were swept away from the wafer surface by the gas flow. The particles are thus removed from the chamber by the chamber vacuum system.

To maximize the removal of particles in accordance with the invention, the maximum gas flow is maintained consistent with maintaining a steady pressure within the vacuum chamber. The number of particles lifted by turning the plasma on depends on the gas pressure and the RF power applied. The amount of power and the gas pressure are manipulated to maximize lifting and removal of particles in a particular vacuum chamber.

Preferably the steps of turning on the plasma and sweeping away lifted particles are repeated a plurality of times, whereby additional particles are lifted from the surface and which can then be swept away from the surface of the substrate.

The particle removal step can be advantageously performed prior to other processing in the vacuum chamber, e.g., pre-cleaning, etching or PECVD processing. However, when a multi-chamber processing apparatus such as is disclosed in the above-mentioned patent is employed, particle removal can also be performed after processing to remove any loose particles from the processed substrate surface, before transporting the substrate into another chamber for additional processing, thereby reducing the danger of contaminating the transfer chamber as well.

The present invention has been described by means of specific embodiments and processes. However, one skilled in the art can readily vary the equipment and parameters described, and the invention is meant to be limited only by the scope of the attached claims.

I claim:

1. A method of removing particles from the surface of a substrate to be processed in a vacuum chamber comprising the following steps in sequence;
    a) lifting loosely adhered particles from the surface of said substrate by turning on a plasma from an inert plasma precursor gas, and
    b) increasing the flow of said inert plasma precursor gas to sweep the lifted particles beyond the surface of said substrate.

2. A method according to claim 1 wherein said precursor gas is argon.

3. A method according to claim i wherein the pressure in said vacuum chamber is maintained at about 50 millitorr or less.

4. A method of removing particles from the surface of a substrate to be processed in a vacuum chamber comprising the following steps in sequence;
    a) lifting loosely adhered particles from the surface of said substrate by turning on a plasma from an inert plasma precursor gas, and
    b) increasing the flow of said insert plasma precursor gas to sweep the lifted particles beyond the surface of said substrate and repeating steps a) and b).

5. A method according to claim 1 wherein the particles range in size from 0.1 micron or more.

6. A method according to claim 1 wherein the particles are lifted in an argon flow of about 25 sccm in a chamber held at 25 millitorr pressure.

7. A method according to claim 6 wherein the argon flow is increased to 50–100 sccm so that the lifted particles can be swept away from the surface of the substrate.

* * * * *